US005386625A

United States Patent [19]
Tsukamoto

[11] Patent Number: 5,386,625
[45] Date of Patent: Feb. 7, 1995

[54] TAB TYPE IC ASSEMBLING METHOD AND AN IC ASSEMBLED THEREBY

[75] Inventor: Kenji Tsukamoto, Tokyo, Japan

[73] Assignee: NEC Corporation, Tokyo, Japan

[21] Appl. No.: 208,079

[22] Filed: Mar. 9, 1994

Related U.S. Application Data

[63] Continuation of Ser. No. 18,517, Feb. 17, 1993, abandoned.

[30] Foreign Application Priority Data

Feb. 17, 1992 [JP] Japan .................. 4-029429

[51] Int. Cl.⁶ .............................. H05K 3/30
[52] U.S. Cl. ..................... 29/835; 174/52.4; 228/5.1; 228/6.2; 361/772
[58] Field of Search ............. 174/52.1, 52.4, 88 R, 174/94 R; 29/837, 838, 839, 841, 846, DIG. 3, 835, 831; 228/173.1, 173.2, 173.5, 5.1, 6.1, 6.2, 180.1; 361/772, 773, 774

[56] References Cited

U.S. PATENT DOCUMENTS

| | | | |
|---|---|---|---|
| 3,902,148 | 8/1975 | Drees et al. | 29/553 X |
| 4,050,618 | 9/1977 | Angelucci et al. | 228/6.1 |
| 4,054,238 | 10/1977 | Lloyd et al. | 228/173 R |
| 4,224,637 | 9/1980 | Hargis | 357/74 |
| 4,271,426 | 6/1981 | Hargis | 357/74 |
| 4,331,831 | 5/1982 | Ingram et al. | 174/52.4 |
| 4,380,042 | 4/1983 | Angelucci et al. | 361/421 |
| 4,514,750 | 4/1985 | Adams | 174/52.4 X |
| 4,531,044 | 7/1985 | Chang | 219/121.85 |
| 4,584,627 | 4/1986 | Schilling et al. | 174/52.4 X |
| 4,642,419 | 2/1987 | Meddles | 174/52.4 |
| 4,725,692 | 2/1988 | Ishii et al. | 174/52.4 |
| 4,759,771 | 7/1988 | Morra | 29/623.1 |
| 4,814,855 | 3/1989 | Hodgson et al. | 174/52.4 |
| 4,862,246 | 8/1989 | Masuda et al. | 357/70 |
| 4,920,074 | 4/1990 | Shimuzu et al. | 361/421 X |
| 4,980,802 | 12/1990 | Champagne et al. | 361/408 X |
| 4,982,265 | 1/1991 | Watanabe et al. | 357/75 |
| 4,985,663 | 1/1991 | Nakatani | 174/52.4 X |
| 5,018,005 | 5/1991 | Lin et al. | 361/408 X |
| 5,064,706 | 11/1991 | Ueda | 174/52.4 X |
| 5,121,300 | 6/1992 | Shimizu | 174/52.4 X |
| 5,137,479 | 8/1992 | Ohikata et al. | 361/421 X |

Primary Examiner—Leo P. Picard
Assistant Examiner—Christopher Horgan
Attorney, Agent, or Firm—Sughrue, Mion, Zinn, Macpeak & Seas

[57] ABSTRACT

A method of assembling an integrated circuit (IC) by a TAB (Tape Automated Bonding) system, and an IC assembled thereby. Leads extending from a TAB tape and connected to an IC are each partly reduced in width. Hence, even when the end portions of the leads are deformed by some object by accident, it is not necessary to correct the shape of the leads since such end portions will be eventually cut off and discarded in the event of packaging of the IC.

2 Claims, 4 Drawing Sheets

TAB TYPE IC ASSEMBLING METHOD AND AN IC ASSEMBLED THEREBY

This is a continuation of application Ser. No. 08/018,517 filed Feb. 17, 1993, abandoned.

BACKGROUND OF THE INVENTION

The present invention relates to a method of assembling an integrated circuit (IC) by a TAB (Tape Automated Bonding) system, and an integrated circuit assembled thereby and, more particularly, to the configuration of leads of a TAB tape.

A TAB system is one of conventional implementations for assembling ICs and uses a TAB tape having leads which are uniform in width. The leads of the tape are connected to an IC. The end portions of the leads are cut off before the IC is actually packaged on a circuit board. To mount the IC on a circuit board, the leads are each positioned on a particular pad provided on the circuit board and then soldered to the pad.

However, the problem with the TAB system is that the leads connected to the IC and separated from the tape are not stable before the IC is packaged on the circuit board. Specifically, the leads easily deform when some object accidentally contacts the ends thereof. As a result, it is likely that the distance between nearby leads becomes irregular or that nearby leads contact each other. This makes it difficult to accurately position the leads on the associated pads of the circuit board. Moreover, the deformed leads have to be corrected in shape by an extra step.

SUMMARY OF THE INVENTION

It is, therefore, an object of the present invention to provide a TAB type IC assembling method which prevents the leads cut off from a TAB from deforming and thereby allows the leads to be readily positioned in the event of packaging the IC on a circuit board, and an IC assembled thereby.

In accordance with the present invention, in an IC assembled by a TAB system, leads extending from a TAB tape to be connected to the IC each has a portion smaller in width than the other portion.

Also in accordance with the present invention, a method of assembling an IC by a TAB system comprises the steps of producing a TAB tape having leads each including a portion smaller in width than the other portion, connecting the leads to an IC, cutting off end portions of the leads to separate the IC from the TAB tape, positioning the IC on predetermined pads provided on a circuit board, and soldering the leads of the IC to the pads while pressing the leads.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
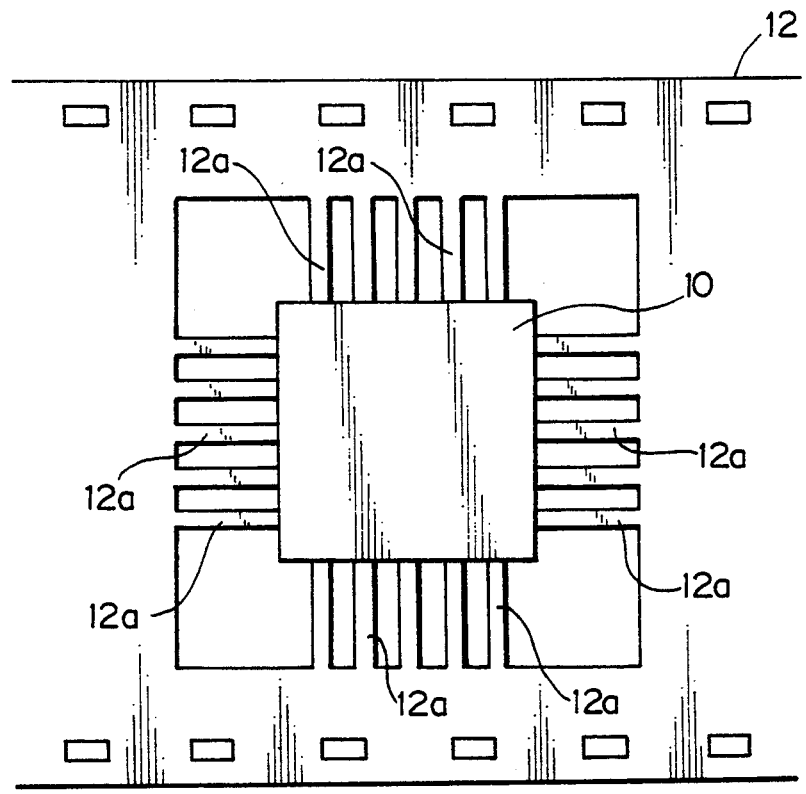
FIG. 1 is a plan view of an IC assembled by a conventional TAB system.
Figure 2:
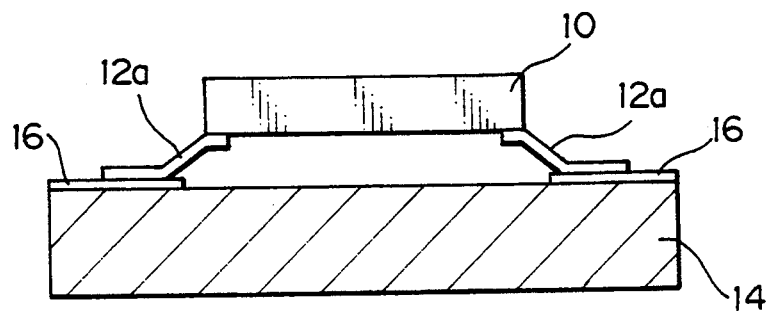
FIG. 2 is a vertical section showing the IC of FIG. 1 packaged on a circuit board.
Figure 3A:
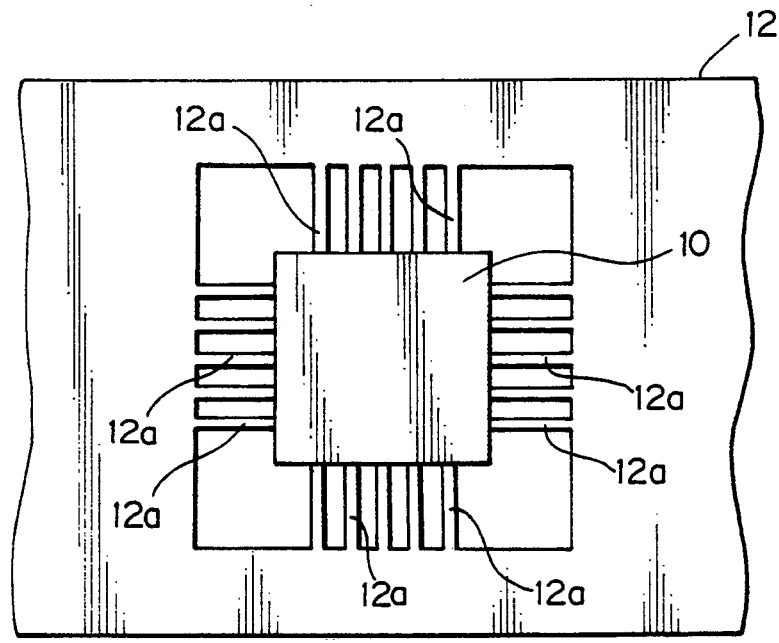
FIGS. 3A and 3B are plan views showing the IC of FIG. 1 in a condition prior to packaging.
Figure 3B:
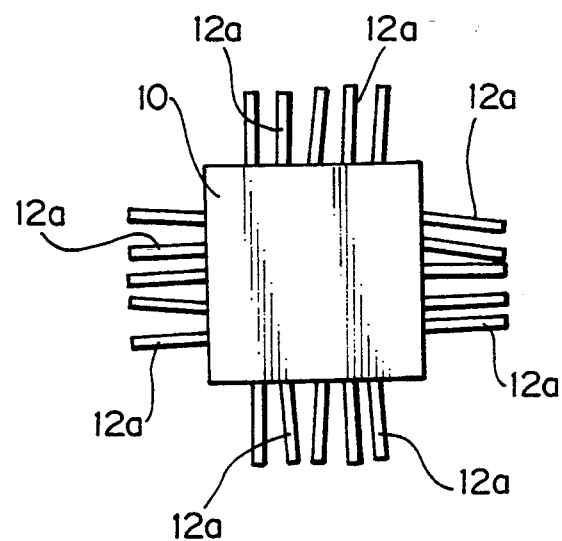

To better understand the present invention, a brief reference will be made to a conventional IC assembled by the TAB system, shown in FIG. 1. As shown, a TAB tape 12 has multiple leads 12a which are connected to an IC 10. After the ends of the leads 12a have been cut off from the tape 12, the IC 10 is mounted on a circuit board 14, as shown in FIG. 2. On the circuit board 14, the leads 12a of the IC 10 are each positioned on a particular pad 16 provided on the circuit board 14 and then soldered to the pad 16. Specifically, the leads 12a have their ends cut off from the tape 12 in the condition shown in FIG. 3A. The problem with such an IC 10 is that the leads 12a easily deform when some object contacts the ends thereof. As a result, it is likely that the distance between nearby leads 12a becomes irregular or that nearby leads 12a contact each other, as shown in FIG. 3B specifically. This makes it difficult to accurately position the leads 12a on the associated pads 16 of the circuit board 14. Moreover, the deformed leads 12a have to be corrected in shape by an extra step.

Figure 4:
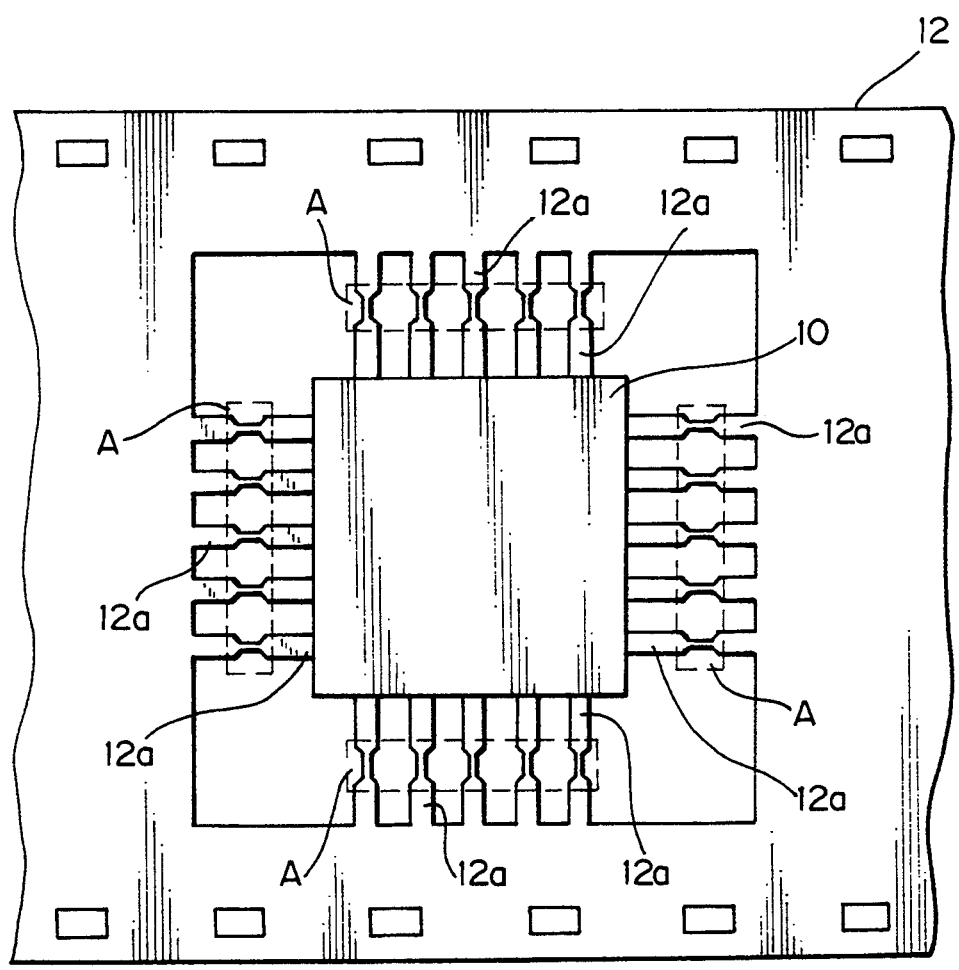
FIG. 4 is a plan view of an IC embodying the present invention and assembled by the TAB system.

Referring to FIG. 4, an IC embodying the present invention and assembled by the TAB system is shown. In FIG. 4, the same or similar constituents as or to those of the conventional assembly are designated by the same reference numerals, and a redundant description will be avoided for simplicity. As shown, an IC 10 is connected to the leads 12a of a TAB tape 12. The embodiment is characterized in that each lead 12a includes a portion A smaller in width than the other portion and positioned at substantially the intermediate between opposite ends of the lead 12a. Specifically, to produce the leads 12a shown in FIG. 4, a webbing for forming the tape 12 is etched in a pattern which provides each lead 12a with the narrower portion A, and then plated or otherwise treated.

Figure 5A:
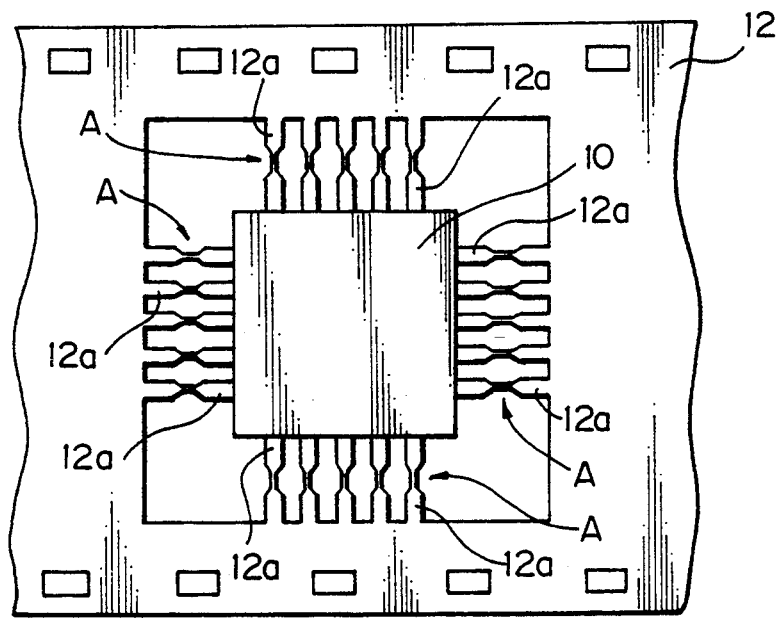
FIGS. 5A and 5B are plan views showing the embodiment in a condition prior to packaging.
Figure 5B:
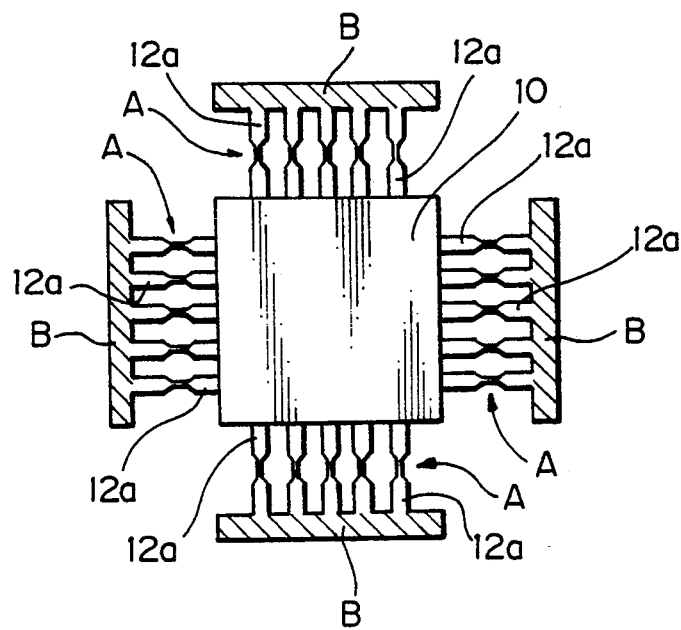

FIG. 5A shows a condition wherein the IC 10 and leads 12 connected to each other, but the leads 12 are not separated from the tape 12. FIG. 5B shows a condition wherein the leads 12a are separated from the tape 12, but their ends are still connected by portions B indicated by hatching. The portions B prevent the leads 12a from being deformed by an object which may contact the ends of the leads 12a by accident.

In summary, it will be seen in accordance with the present invention, leads extending from a TAB tape and connected to an IC are each partly reduced in width. Hence, even when the end portions of the leads are deformed by some article by accident, it is not necessary to correct the shape of the leads since such end portions will be eventually cut off and discarded in the event of packaging of the IC. Therefore, the IC with the leads can be easily positioned on a circuit board. In addition, when the end portions of the leads are to be separated, the other portions of the leads soldered to associated pads are pulled. This is successful in testing the leads as to the bond at the same time.

Various modifications will become possible for those skilled in the art after receiving the teachings of the present disclosure without departing from the scope thereof.

What is claimed is:

1. A method of assembling an IC device by a TAB system, comprising the steps of:

(a) producing a TAB tape having leads each including a first width in a first region to be adjacent to an IC, a second width narrower than said first width in a second region farther away from said IC than said first region, and a third width wider than said second width in a third region at outer end portions of said leads;

(b) connecting said leads to said IC;

(c) separating said leads from said TAB tape such that a predetermined number of said leads are connected at said portions thereof;

(d) positioning said IC on predetermined pads provided on a circuit board;

(e) soldering said leads of said IC to said pads while pressing said leads;

(f) bending said leads at said second region; and (g) after said bending step, removing said end portions of said leads from said leads.

2. A method as claimed in claim 1, wherein step (a) comprises the steps of:

(h) etching a webbing for forming said TAB tape in a pattern which provides each of said leads with said widths in said respective regions; and (i) plating said leads.

* * * * *